United States Patent [19]

Asano et al.

[11] Patent Number: 5,641,839
[45] Date of Patent: Jun. 24, 1997

[54] NOVOLAC TYPE EPOXY RESIN AND ELECTRONIC PARTS ENCAPSULATING RESIN COMPOSITION

[75] Inventors: Chiaki Asano, Narashino; Seigo Takuwa, Funabashi; Hideyasu Asakage, Tokyo, all of Japan

[73] Assignee: Totokasei Co., Ltd., Tokyo, Japan

[21] Appl. No.: 506,133

[22] Filed: Jul. 24, 1995

Related U.S. Application Data

[63] Continuation of Ser. No. 234,946, Apr. 28, 1994, abandoned.
[51] Int. Cl.$^6$ .......................... C08F 283/00; C08G 59/40
[52] U.S. Cl. .......................... 525/480; 525/485; 525/507; 525/523; 525/534; 528/110
[58] Field of Search ............................. 525/438, 472, 525/480, 507, 523, 533, 534, 485; 528/110

[56] References Cited

U.S. PATENT DOCUMENTS

| | | | |
|---|---|---|---|
| 2,928,810 | 3/1960 | Belanger | 528/110 |
| 3,670,047 | 6/1972 | Broecker | 525/530 |
| 4,661,541 | 4/1987 | Batzill et al. | 525/110 |
| 4,707,535 | 11/1987 | Koleske | 528/110 |
| 4,783,509 | 11/1988 | Cavitt et al. | 525/523 |
| 4,981,754 | 1/1991 | Hsu | 525/523 |
| 5,019,639 | 5/1991 | Hofer et al. | 528/110 |
| 5,334,674 | 8/1994 | Naka et al. | 525/481 |
| 5,342,903 | 8/1994 | Wolleb et al. | 525/523 |

FOREIGN PATENT DOCUMENTS

| | | |
|---|---|---|
| 0281213 | 9/1988 | European Pat. Off. . |
| 55-112231 | 8/1980 | Japan . |
| 0112231 | 8/1980 | Japan . |
| 58-74714 | 5/1983 | Japan . |

*Primary Examiner*—Melvyn I. Marquis
*Assistant Examiner*—Randy Gulakowski
*Attorney, Agent, or Firm*—Sherman and Shalloway

[57] ABSTRACT

This invention relates to a semiconductor encapsulating novolac type epoxy resin with the reduced stress, which is obtained by an addition reaction 1 to 15% of a novolac type epoxy resin of the following formula with a monohydric or dihydric aliphatic alcohol:

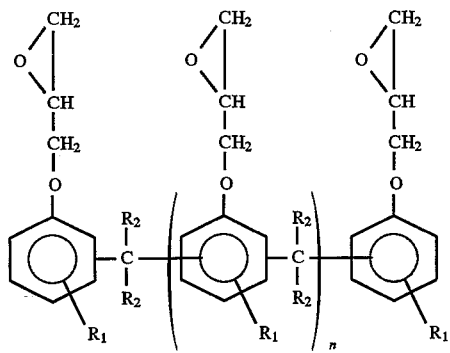

(wherein $R_1$ is hydrogen, halogen, alkyl, or aryl; $R_2$ is selected from the group consisting of hydrogen, alkyl, aryl, or aryl having a substituent which may be glycidylether; and n is an integer not less than 0.)

8 Claims, No Drawings

NOVOLAC TYPE EPOXY RESIN AND ELECTRONIC PARTS ENCAPSULATING RESIN COMPOSITION

This application is a continuation of application Ser. No. 08/234,946, filed Apr. 28, 1994 now abandoned.

BACKGROUND OF THE INVENTION

This invention relates mainly to an improved novolac type epoxy resin suitable for electric and electronic industry, an electronic parts encapsulating resin composition containing the resin, and particularly to a semiconductor encapsulating epoxy resin, resin composition, and encapsulated parts with reduced stress to the parts.

DESCRIPTION OF THE PRIOR ART

Epoxy resin is used in a substrate for constructing electronic devices and parts such as LSIs and laminated boards and, recently, is drawing industrial attention as an electronic parts encapsulating material such as ICs in the field of electronics which is under rapid technical innovation.

In general, an epoxy resin composition used in these epoxy resin molding compounds is produced from an epoxy resin, a hardener, an accelerator, a filler, a fire retardant agent, a coupling agent, a release agent, and a coloring agent, which are mixed and kneaded to form a composition and used as a molding compound.

Heretofore, as an epoxy resin for these molding compounds, an o-cresol novolac type epoxy resin is widely used for its heat resistance, moldability, and electrical characteristics, and a combination with phenol novolac resin is often used as a hardener.

However, recently, with the tendency of semiconductor devices to higher integration, the chip size becomes larger but the package size is almost unchanged. Therefore, malfunction due to thermal stress becomes a problem, and an improved encapsulating material with reduced stress is in demand. Further, with reduction in size of electronic devices, compact and thin-walled packages are being required, and surface packages enabling high-density packaging such as QFP, SOP, SOJ, and the like are increasing. Since, in the surface mount technology, the package is subjected to a high thermal stress in the soldering treatment of the mounting process, the package is required to have heat resistance and low stress that can withstand such thermal shocks.

Heretofore, starting from the combination of o-cresol novolac type epoxy resin with phenol novolac resin, several methods have been proposed and used which simultaneously meet heat resistance of the encapsulating material and low stress. For example, there is a method in which silicone oil is added to form particles of 5 to 10 μm in diameter which are dispersed in the resin. However, this method has a problem in that it results in a reduction in mechanical strength and poor adhesion to the lead frame. Furthermore, a method to disperse silicone rubber particles of 5 to 150 μm in the resin is used. This method can improve the adhesion and mechanical strength, but does not provide a sufficiently reduced modulus. In another method, epoxy resin is modified with a liquid synthetic rubber having a reactive group such as vinyl, carboxyl, or amino as a terminal group to reduce the stress. In this case, the modification rate must be increased to obtain an effect of reduced stress, which leads to deterioration in curability.

Further, these improved methods not only have the above defects, but are high in cost and less suited for general-purpose uses.

As a proposal to solve such problems, according to Japanese Laid-open Patent Publication 5-291437, a fracture toughness (Kc) and an internal stress (σ) can be determined from a modulus (E) and a lineal- thermal expansion coefficient (α) according to the following equation.

$$\sigma = \int E(T) \cdot \alpha(T) dT$$

In this case, it is known that the linear thermal expansion coefficient is largely affected by the content of silica powder used, and influence of epoxy resin used is small. Therefore, σ can be x-educed by decreasing the modulus (E), and as a result, Kc/σ can be increased.

SUMMARY OF THE INVENTION

A primary object of the present invention is to provide an improved substituted or unsubstituted novolac epoxy resin, an electronic parts encapsulating resin composition, and encapsulated parts which maintain heat, resistance and mechanical characteristics and have reduced stress which could not be achieved by the prior art.

DETAILED DESCRIPTION OF THE INVENTION

The inventors have conducted intensive studies to obtain a novolac epoxy resin composition which maintains heat resistance and, mechanical characteristics and has a low stress and, with an eye on the fact that novolac epoxy resin has a large number of average epoxy groups in the molecule of 7 to 11, found that the large number of functional groups increases the modulus resulting in a hard and brittle resin. It has been found that by slightly reducing the functional group content, the cross-linking density and modulus (E) can be decreased while maintaining the heat resistance and mechanical characteristics, thereby achieving a low stress.

In view of the specific application of electronic parts encapsulating material, selection of a modifier to decrease the functional group density and the modification degree are important. To evaluate the moisture resistance reliability, the encapsulated part must pass a strict test which is generally referred to a bias type PCT test. In this test, the test specimen is treated under a high temperature and humidity environment of 2 to 4 atms, 120° to 140° C., and an applied voltage of 10 to 20VDC, and determined for a defect rate of the aluminum circuit corroded by corrosive ions. Therefore, the specimen should not be decomposed or deteriorated to generate corrosive ions (inorganic, organic) during the test.

The inventors have found that the above object can be achieved by selecting a monohydric or dihydric aliphatic alcohol having 12 or less carbon atoms and at least one primary hydroxyl group (hereinafter simply referred to as "alcohol").

In a basic reaction method of the present invention, part of a substituted or unsubstituted novolac epoxy resin is reacted with the above monohydric or dihydric alcohol. The reaction formula is as shown below:

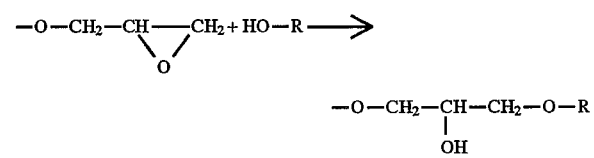

wherein R is an alcohol residue.

The above reaction is achieved by addition reaction of 1 to 15% of epoxy group of novolac type epoxy resin with a monohydric or dihydric alcohol. A modification degree of not more than 1 mole % results In an insufficient reduction of stress, and a modification degree exceeding 15 mole % results in a decrease in mechanical strength, high water absorption, and poor soldering resistance.

The monohydric or dihydric alcohol used in the present invention must be an aliphatic alcohol having at least one primary hydroxyl group. This is because epoxy group and primary hydroxyl group react under a relatively moderate reaction condition. The number of carbon atoms of the aliphatic alcohol is not specifically limited if it is not more than 12. However, a too small number of carbon atoms has a high vapor pressure, and is thus economically disadvantageous because a reaction under pressure is required. Twelve (12) or more carbon atoms results in a decrease in reactivity, which is also not economical. Further, in view of removal of unreacted alcohol, it is preferable that the alcohol has a high vapor pressure to some extent to be removed by vacuum evaporation or is water soluble so that it can be removed by simple water washing.

Alcohols that can be used in the present invention include monohydric alcohols such as methanol, ethanol, n-propanol, n-butanol, isobutanol, n-amyl alcohol, n-hexanol, n-heptanol, n-octanol, nonanol, n-decanol, undecanol, n-dodecanol, glycidol, furfuryl alcohol, tetrahydrofurfuryl alcohol, and benzyl alcohol; glycols and their ether derivatives such as ethyleneglycol, ethyleneglycolmonomethylether, ethyleneglycolmonoethylether, ethyleneglycolmonobutylether, ethyleneglycolisoamylether, ethyleneglycolmonophenylether, ethyleneglycolbenzylether, ethyleneglycolmonohexylether, diethyleneglycol, diethyleneglycolmonomethylether, diethyleneglycolmonoethylether, diethyleneglycolmonobutylether, triethyleneglycol, triethyleneglycolmonomethylether, tetraethyleneglycol, polyethyleneglycol, propyleneglycol, propyleneglycolmonomethylether, propyleneglycolmonobutylether, propyleneglycolmonobutylether, dipropyleneglycol, dipropyleneglycolmonomethylether, polypropyleneglycol, trimethyleneglycol, butanediol, 1,5-pentanediol, hexyleneglycol, 1,6-hexanediol, octyleneglycol, hexylenediol, octyleneglycol, glycerin, and neopentylglycol.

The novolac type epoxy resin used in the present invention may be either a substituted type or an unsubstituted type. Novolac type epoxy resin is obtained basically by reacting novolac resin with epichlorohydrin in the presence of an alkali metal hydroxide.

Examples of novolac resin include those obtained by reacting phenols such as phenol, o-cresol, m-cresol, p-cresol, p-tert-butylphenol, p-nonylphenol, 2,6-xylenol, resorcinol, bisphenol-A, α and β-naphthol, and naphthalenediol with aldehydes such as acetaldehyde, formaldehyde, furfural, glyoxal, and p-hydroxybenzaldehyde in the presence of an acid catalyst.

Furthermore, a novolac resin obtained by a method in which the above phenols and aldehydes are reacted in the presence of an alkali catalyst to yield a methylolated compound of the corresponding phenol, which is then reacted with phenols in the presence of an acid catalyst can also be used.

Of these novolac resins, o-cresol novolac resin is particularly important.

In the production of the improved novolac type epoxy resin according to the present invention, it is advantageous that novolac resin and epichlorohydrin are reacted to yield a crude epoxy resin, and then reacted with alcohols in a step for purifying the crude epoxy resin, whereby impurities such as catalyst used and unreacted alcohols can be simply removed by water washing.

The inventive reaction of epoxy resin and primary hydroxyl group of alcohols is preferably carried out in the presence of a catalyst, and an ordinary catalyst known in the art can be used. Examples of the catalyst include metal perchlorates such as magnesium perchlorate and manganese perchlorate, boron salts or ether complex, alkali or alkali earth salts or hydroxide. It is advantageous to use caustic soda as a catalyst which is a ring closing agent used in the epoxy resin refining process.

The reaction of the present invention can be carried out with the novolac type epoxy resin either in a molten state or solution, but use of solution is preferable in view of removing residual catalyst. In the use of solution, usable solvents include ketones such as methylethylketone, methylisobutylketone, acetone, and cyclohexanone; aromatic hydrocarbons such as benzene, toluene, and xylene; halogenated hydrocarbons such as methylenechloride and ethylenechloride; ethers; acetals; esters; alcohols; and nitrogen compounds; which can be used alone or as mixtures thereof.

The reaction of epoxy group and alcohols is carried out using a necessary molar amount or excess of the alcohol, by stopping the reaction at a predetermined conversion rate.

The reaction temperature is 60° to 120° C., more preferably 80° to 100° C. The reaction time is approximately 30 minutes to 10 hours. Residual catalyst and unreacted alcohol can be simply removed by washing the resin solution with water. Impurities are removed by water washing, and the solvent is recovered under vacuum to obtain the improved novolac type epoxy resin of the present invention.

The electronic parts encapsulating epoxy resin composition of the present invention can be mixed with one or more inorganic fillers such as powders of fused silica, crystalline silica, alumina, zircon, calcium silicate, calcium carbonate, silicon carbide, silicon nitride, boron nitride, beryllia, magnesia, zirconia, forsterite, steatite, spinel, mullite, and titania; single crystal fibers of potassium titanate, silicon carbide, nitrogen carbide, and alumina; and glass fiber. Content of the inorganic filler is not specifically limited, but is preferably 40 to 70% by volume.

Furthermore, the electronic parts encapsulating epoxy resin molding compound of the present invention can be used in combination with fire retardant agents such as antimony trioxide, brominated epoxies including EPO-TOHTO YDB-400 (Tohto Kasei) and BREN (Nippon Kayaku); release agents such as higher fatty acid, higher fatty acid metal salt, and ester type wax; coloring agents such as carbon; and coupling agents such as epoxysilane, aminosilane, vinylsilane, alkylsilane, organic titanate, and aluminum alkonate.

In a general method for producing a molding compound using the above raw materials, a mixture of predetermined amounts of raw materials is thoroughly mixed by a mixer or the like, kneaded by a heat roll, an extruder, or the like, cooled, and crushed to obtain a molding compound.

In a method for producing an electronic part using the molding compound obtained in the present invention, a low-pressure transfer molding method is most commonly used, and injection molding and compression molding can also be used.

DETAILED DESCRIPTION OF PREFERRED EMBODIMENTS

The present invention will now be described with reference to the Examples, but the present invention is not limited to the Examples.

Example 1

In a 3-liter separable flask type reaction vessel with a stirrer, a thermometer, and a condenser, 750 g of YDCN-701S 701S (Tohto Kasei) as an o-cresol novolac epoxy resin having an epoxy equivalent of 199.8 g/eq and an ICI viscosity of 4.4 poises at 150° C. and 1,390 g of methylisobutylketone (hereinafter referred to as MIBK) as a solvent were charged, heated to 80° C. and stirred to dissolve the resin. Then, 52.5 g of ethyleneglycol and 15.4 ml of 10 wt. % aqueous caustic soda solution as a catalyst were added and reacted at 80° C. for 2.5 hours. After that, 857 g of MIBK and 750 g of ion exchanged water were added and stirred at 80° C. for 20 minutes, allowed to stand, and water layer was separated. Further, 750 g of ion exchanged water was added, neutralized with 5 wt. % $NaH_2PO_4$, allowed to stand, and water layer was separated. The resulting solution was similarly once more washed only with 750 g of ion exchanged water. After the resin solution was filtered, the solvent was removed using a rotary evaporator at 5 Torr, 180° C., for 30 minutes to obtain an improved o-cresol novolac epoxy resin EX-1. Properties of the resin are shown in Table 1.

Example 2

Using the same procedure as in Example 1 except that 22.5 g of ethyleneglycol was used, an improved o-cresol novolac epoxy resin EX-2 was obtained. Properties of the resin are shown in Table 1.

Example 3

Using the same procedure as in Example 1 except that 75.0 g of ethyleneglycol and 22.0 ml of 10% aqueous caustic soda solution were used, an improved o-cresol novolac epoxy resin EX-3 was obtained. Properties of the resin are shown in Table 1.

Example 4

Using the same procedure as in Example 1 except that 37.5 g of propyleneglycol in place of ethyleneglycol and 12.3 ml of 10% aqueous caustic soda solution were used, and reacted for 2 hours, an improved o-cresol novolac epoxy resin EX-4 was obtained. Properties of the resin are shown in Table 1.

Example 5

Using the same procedure as in Example 1 except that 750 g of a p-tert-butylphenol novolac epoxy resin ZX-1071 (Tohto Kasei) having an epoxy equivalent of 334.7 g/eq and a softening point of 73.5° C. and 1,390 g of MIBK were charged to dissolve, heated to 80° C., and 52.5 g of ethyleneglycol and 12.3 ml of 10% aqueous caustic soda solution were used, an improved p-tert-butylphenol novolac epoxy resin EX-5 was obtained. Properties of the resin are shown in Table 1.

Example 6

In a glass-made separable flask, 120 parts of o-cresol novolac epoxy resin (Tohto Kasei, D-5) having a softening point of 100° C., 647.5 parts of epichlorohydrin, 65 parts of diethyleneglycoldimethylether, and 1.5 parts of benzyltriethylammonium chloride were charged, stirred and reacted at 100° to 110° C. for 3 hours. Then, under a vacuum of 150 Torr, while maintaining a temperature of 65° to 70° C., 81.7 parts of 49 wt. % caustic soda was dropped in 4 hours. During dropping, epichlorohydrin was boiled as the water azeotrope, and separated water was removed. After completion of the reaction, unreacted epichlorohydrin was recovered under vacuum, and 410 parts of MIBK was added to dissolve the resulting polyglycidylether. 300 parts of water was added to dissolve the generated salt, and allowed to stand to separate the underlayer salt solution. Then, 12.3 parts of ethyleneglycol and 3.6 ml of 10 wt. % aqueous caustic soda solution were added, reacted at 85° C. for 3 hours, neutralized with aqueous phosphoric acid solution, and the resin solution was washed with water until the washed water became neutral. MIBK was distilled out under a vacuum of 5 Torr at 180° C. to obtain an objective improved o-cresol novolac epoxy resin EX-6. Properties of the resin are shown in Table 1.

TABLE 1

Properties of the resins obtained in the Examples

| Resin | EEW g/eq. | VIS. poise at 150° C. | GPC Data | | | Addition to total epoxy mole % *1 | Remarks |
| --- | --- | --- | --- | --- | --- | --- | --- |
| | | | Mn | Mw | Mw/Mn | | |
| Control | 199.8 | 4.4 | 989 | 1960 | 1.98 | 0 | YDCN-701S |
| EX-1 | 207.7 | 5.4 | 1158 | 2455 | 2.12 | 2.96 | |
| EX-2 | 204.0 | 5.5 | 1151 | 2471 | 2.15 | 2.82 | |
| EX-3 | 230.0 | 9.5 | 1230 | 3055 | 2.27 | 10.48 | |
| EX-4 | 208.0 | 5.5 | 1160 | 2451 | 2.11 | 2.90 | |
| EX-5 | 377.3 | 6.3 | 1101 | 2541 | 2.31 | 9.70 | |
| EX-6 | 220.5 | 5.3 | 1175 | 2705 | 2.30 | 7.47 | |

EEW: Epoxy equivalent, measured according to JIS K7236
VIS: Melt viscosity, measured by ICI viscometer at 150° C.
GPC: Gel permeation chromatograph, molecular weight in polystyrene equivalent
*1: Addition mole % calculated from epoxy equivalent.

Next, Examples of holding compound will be shown.
Examples 7 and 8, Comparative Example 1
Epoxy resins obtained in Examples 1 and 6 and unmodified o-cresol novolac epoxy resin (YDCN-701S, Tohto Kasei) in amounts of 100 parts by weight, 55 parts by weight of phenol novolac resin (BRG-555B, Showa Highpolymer, softening point: 67° C., average molecular weight.: 800) as a hardener, 400 parts by weight of fused silica (RD-8, Tatsumori), 17 parts by weight of brominated epoxy resin (YDB-400, Tohto Kasei) as a fire-retardant agent, 2 parts by weight of 2,4,6-tris (dimethylaminomethyl)phenol (DMP-30, Rohm and Haas) as an accelerator, 4 parts by weight of antimony trioxide (ATOX-3, Nippon Seiko), 1 part by weight of calcium stearate (Seido Kagaku), and 1.5 parts by weight of silane coupling agent, (KBK403, Shin-Etsu Chemical) were preliminarily mixed by a Henschel mixer, melt-kneaded using a biaxial kneader (SIKRAC Kneader, Kurimoto Tekko) at 80° to 100° C., rapidly cooled, and crushed to obtain a molding compound. Then using a mold, the compound was precured by compression molding at 65 kg/cm$^2$, 120° C., for 10 minutes, followed by curing at 180° C. for 5 hours to obtain a test specimen for physical properties. Physical properties test results are shown in Table 2.

The physical properties were measured by the following methods.

Glass transition temp.(Tg)-TMA: Measured by a thermomechanical tester (TMA) Shimadzu TMC-30 at a temperature increasing rate of 5° C./min.

Flexural strength, flexural modulus: Measured according to JIS K6911.

Water absorption rate: A 50 mm diameter, 2 mm thick disk-formed molding was measured using a pressure cooker Lester for an increase in weight at 121° C., 100% RH, for 200 hours.

Dielectric strength: Measured according to JIS K6911.

Volume resistivity: Measured according to JIS K6911.

TABLE 2

Physical properties test results of cured resins

| | Unit | Comp. Ex. 1 YDCN-701S | Ex. 7 EX-1 | Ex. 8 EX-6 |
|---|---|---|---|---|
| Tg | | | | |
| TMA method | °C. | 154 | 155 | 153 |
| DMA method | | 198 | 197 | 198 |
| Water absorption | wt. % | 0.88 | 0.86 | 0.86 |
| Dielectric strength | KV/mm | 26.8 | 27.3 | 26.5 |
| Volume resistivity | | | | |
| Room temp. | | | | |
| Before treatment | Ohm-cm | 41 | 43 | 42 |
| After treatment | ×10$^{15}$ | 0.62 | 1.2 | 0.9 |
| 150° C. | | 0.44 | 0.48 | 0.45 |
| Linear expansion coefficient | | | | |
| α1 | ×10$^{-5}$ | 2.3 | 2.2 | 2.1 |
| α2 | | 7.4 | 7.5 | 7.6 |
| Flexural test | | | | |
| Room temp. | | | | |
| Strength | | 11.9 | 11.6 | 11.2 |
| Modulus (E) | kg/mm$^2$ | 1149 | 1008 | 978 |
| At 250° C. | | | | |
| Strength | | 1.35 | 1.35 | 1.31 |
| Modulus | | 92.5 | 58.8 | 55.2 |
| Internal stress σ (25° C.) | kg/mm$^2$ | 6.6 | 5.5 | 5.1 |

As can be seen from Table 2, the epoxy resin molding compound according to the present invention is confirmed to achieve a low stress (α) with almost no degradation in general physical properties such as thermal characteristics, electrical characteristics, and mechanical strength.

What is claimed is:

1. A modified, substituted or unsubstituted, novolac epoxy resin represented by the formula (A), having improved characteristics of the cured resin for use in an electronic parts encapsulating composition:

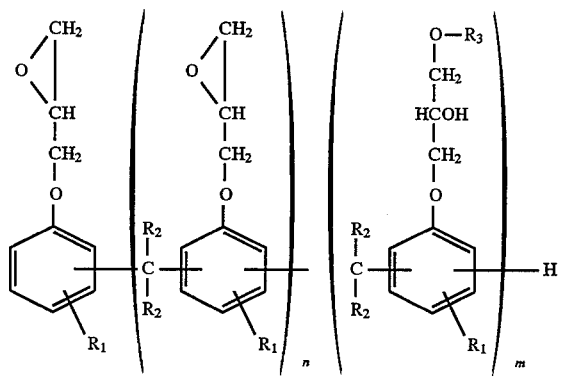

wherein
m and n are selected such that, on the average, (i) the the sum of the epoxy groups

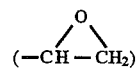

and the modified epoxy groups (—CHOH—CH$_2$—O—R$_3$) in the molecule is a number of 7 to 11, and (ii) the ratio of modified epoxy groups (—CHOH—CH$_2$—O—R$_3$) to the sum of the epoxy groups

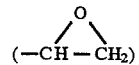

and the modified epoxy groups (—CHOH—CH$_2$—O—R$_3$) in the molecule is 0.01 to 0.15, R$_1$ is a hydrogen atom, a halogen atom, an alkyl group or an aryl group, R$_2$ is a hydrogen atom, an alkyl group, an aryl group or an aryl group substituted by glycidyl ether, and R$_3$ denotes a dihydric aliphatic alcohol residue.

2. A method for the production of a modified, substituted or unsubstituted, novolac epoxy resin as claimed in claim 1, said method comprising:

reacting a substituted or unsubstituted novolac epoxy resin of the following formula

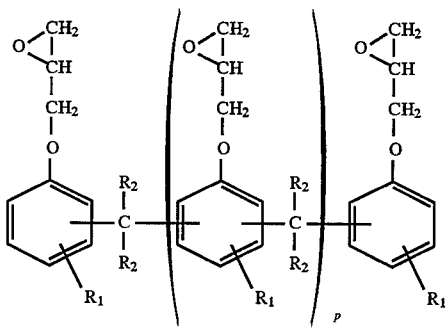

wherein
p is selected such that, on the average, the novolac epoxy resin has 7 to 11 epoxy groups in the molecule R$_1$ is a hydrogen atom, a halogen atom, an alkyl group or an aryl group, and $R_2$ is a hydrogen atom, an alkyl group, an aryl group or an aryl group substituted by glycidyl ether with a dihydric aliphatic alcohol in the presence of caustic soda as a reaction catalyst.

3. The modified novolac epoxy resin of claim 1, wherein said dihydric alcohol is an aliphatic alcohol having at least one primary hydroxyl group.

4. The modified novolac epoxy resin of claim 3, wherein said dihydric alcohol is an aliphatic alcohol having 12 or less carbon atoms.

5. The modified novolac epoxy resin of claim 1, wherein said aliphatic alcohol is ethyleneglycol or propyleneglycol.

6. The modified novolac epoxy resin of claim 1, wherein said novolac epoxy resin is an o-cresol novolac epoxy resin.

7. An electronic parts encapsulating resin composition comprising the modified novolac epoxy resin of claim 1 and a hardener.

8. Electronic parts encapsulated in the encapsulating resin composition of claim 7.

* * * * *